United States Patent
Chen et al.

(10) Patent No.: US 6,667,249 B1
(45) Date of Patent: Dec. 23, 2003

(54) MINIMIZING COATING DEFECTS IN LOW DIELECTRIC CONSTANT FILMS

(75) Inventors: Yu-Hui Chen, Hsin-Chu (TW); Tien-I Bao, Hsin-Chu (TW); Yao-Yi Cheng, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/101,655

(22) Filed: Mar. 20, 2002

(51) Int. Cl.[7] .............................................. H01L 21/31
(52) U.S. Cl. ...................... 438/789; 438/778; 438/780; 438/781; 438/782; 438/784
(58) Field of Search ................................ 438/778, 780, 438/781, 782, 784, 789

(56) References Cited

U.S. PATENT DOCUMENTS

| | | | | |
|---|---|---|---|---|
| 4,267,212 A | * | 5/1981 | Sakawaki | 427/240 |
| 5,066,616 A | | 11/1991 | Gordon | 437/229 |
| 5,246,782 A | | 9/1993 | Kennedy et al. | 428/421 |
| 5,656,555 A | | 8/1997 | Cho | 438/760 |
| 5,962,621 A | * | 10/1999 | Beckerdite et al. | 528/176 |
| 5,998,103 A | * | 12/1999 | Zhang | 427/207.1 |
| 6,066,574 A | * | 5/2000 | You et al. | 438/781 |
| 6,136,729 A | | 10/2000 | Hopper et al. | 438/778 |
| 6,303,524 B1 | * | 10/2001 | Sharangpani et al. | 438/780 |
| 6,436,851 B1 | * | 8/2002 | Young et al. | 438/782 |

FOREIGN PATENT DOCUMENTS

| | | | | |
|---|---|---|---|---|
| JP | 411219948 A | * | 8/1999 | H01L/21/312 |
| JP | 2001300408 A | * | 10/2001 | B05D/1/40 |

OTHER PUBLICATIONS

Nalwa "Handbook of low and high dielectric constant materials and their applications", vol. 1, 1999, p. 66.*

* cited by examiner

*Primary Examiner*—Evan Pert
*Assistant Examiner*—Lisa Kilday
(74) *Attorney, Agent, or Firm*—George O. Saile; Stephen B. Ackerman; Rosemary L. S. Pike

(57) ABSTRACT

A method of coating a low dielectric constant material layer wherein the wafer surface is pre-wetted using a solvent to prevent or reduce coating defects is described. A semiconductor substrate is provided wherein a top surface of the semiconductor substrate may have surface defects. A solvent is coated overlying the top surface of the semiconductor substrate. A low dielectric constant material layer is coated overlying the solvent wherein the solvent covers the surface defects thereby preventing defects in the low dielectric constant material layer.

28 Claims, 1 Drawing Sheet

MINIMIZING COATING DEFECTS IN LOW DIELECTRIC CONSTANT FILMS

BACKGROUND OF THE INVENTION (1) Field of the Invention

The invention relates to a method of forming a low dielectric constant material film in the fabrication of integrated circuits, and more particularly, to a method of minimizing coating defects in forming a low dielectric constant material film in the manufacture of integrated circuits.

(2) Description of the Prior Art

Low dielectric constant (k) materials have been used increasingly in the art in order to minimize RC delay in circuits. Low-k materials are often used especially in damascene processes. Defects in the coating of the low-k materials on a wafer may occur because of particles, roughness, or surface defects. These defects may cause problems such as peeling after chemical mechanical polishing (CMP) and copper plating defects.

U.S. Pat. No. 5,066,616 to Gordon discloses a method of coating a solvent and thereafter coating a photoresist material layer. U.S. Pat. No. 5,246,782 to Kennedy et al teaches forming a polymer laminate where the surface may be prepared using an undisclosed solvent treatment. U.S. Pat. No. 6,146,729 to Hopper et al and U.S. Pat. No. 5,656,555 to Cho show low-k material processes.

SUMMARY OF THE INVENTION

A principal object of the present invention is to provide an effective and very manufacturable method of coating a low dielectric constant material layer in the fabrication of integrated circuit devices.

Another object of the invention is to provide a method of coating a low dielectric constant material in the fabrication of integrated circuit devices wherein coating defects are eliminated.

Yet another object of the invention is to provide a method of coating a low dielectric constant material layer wherein the wafer surface is pre-wetted to prevent coating defects.

A further object is to provide a method of coating a low dielectric constant material layer wherein the wafer surface is pre-wetted using a solvent to prevent or reduce coating defects.

In accordance with the objects of this invention a method of coating a low dielectric constant material layer wherein the wafer surface is pre-wetted using a solvent to prevent or reduce coating defects is achieved. A semiconductor substrate is provided wherein a top surface of the semiconductor substrate may have surface defects. A solvent is coated overlying the top surface of the semiconductor substrate. A low dielectric constant material layer is coated overlying the solvent wherein the solvent covers the surface defects thereby preventing defects in the low dielectric constant material layer.

BRIEF DESCRIPTION OF THE DRAWINGS

In the accompanying drawings forming a material part of this description, there is shown.

DESCRIPTION OF THE PREFERRED EMBODIMENTS

The present invention provides a method of coating a low dielectric constant material layer wherein a thinner or solvent is used to pre-wet the surface of the wafer before the low-k material is coated. This will prevent or reduce coating defects.

Coating defects are caused by particles, roughness, or surface defects on the wafer surface. Low-k materials are especially sensitive to these defects. The critical dimension of the features in applying low-k materials is much smaller than prior art processes. The process is very sensitive to any small surface defects.

Figure 1:
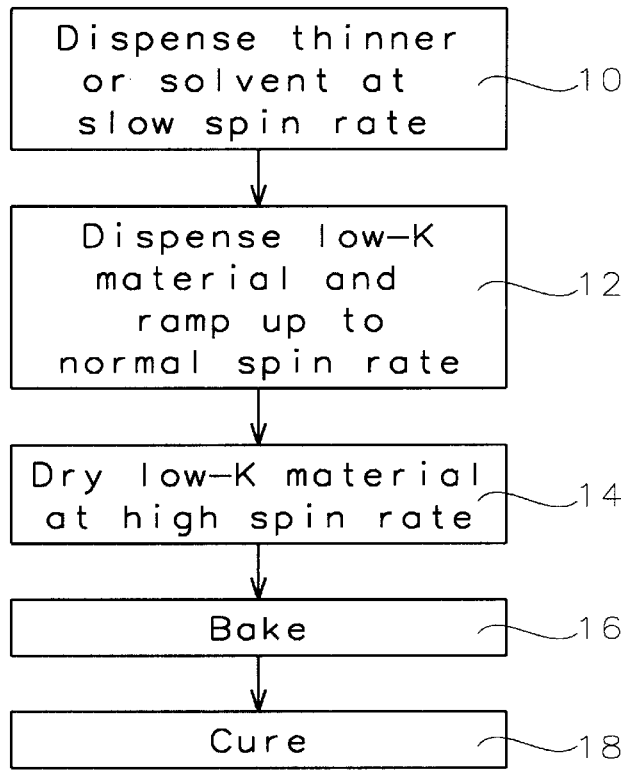
FIG. 1 is a flowchart illustrating the process flow of a preferred embodiment of the present invention.
Figure 2:
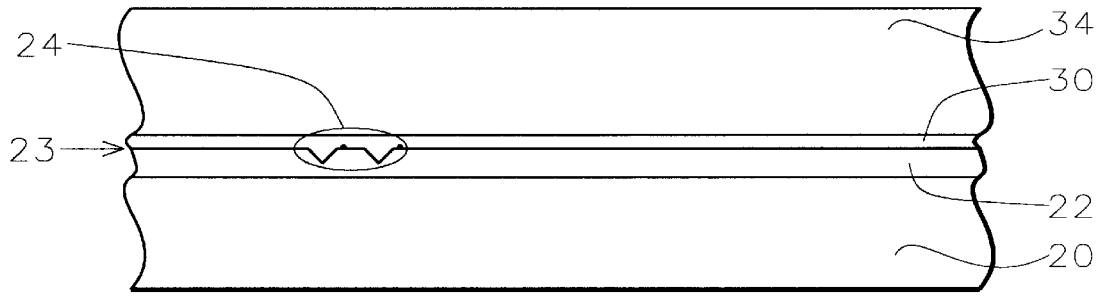
FIGS. 2 and 3 schematically illustrate in cross-sectional representation a preferred embodiment of the present invention.

FIG. 1 illustrates the process flow of the method of the present invention to prevent or reduce coating defects. FIG. 2 illustrates a portion of a partially completed integrated circuit device. There is shown a semiconductor substrate 20, preferably composed of monocrystalline silicon. Semiconductor device structures, such as gate electrodes and source and drain regions, not shown, may be formed in and on the semiconductor substrate. These semiconductor device structures are covered with an insulating layer such as silicon oxide. A first layer of metallization may also be provided. The semiconductor device structures and insulating layer thereover are represented by 22 in FIG. 2. Surface defects such as marks or particles are shown by 24, for example. Particles may come from the coater or other processes. Wafer ID mark roughness may occur. Slight scratches or roughness may be the result of process impact.

Now, a low dielectric constant material is to be deposited over the wafer surface. A low dielectric constant material has a dielectric constant of less than about 3. The presence of the surface defects such as 24 will cause coating defects in the low-k material layer. This would cause problems such as CMP peeling.

A key step of the present invention is illustrated in step 10 of the flowchart of FIG. 1. A thinner or solvent is dispensed on the wafer while the wafer is spun at a slow spin rate of less than about 1000 revolutions per minute (rpm). Between about 1 and 5 milliliters of solvent should be dispensed. The resulting solvent layer 30, illustrated in FIG. 2, will have a thickness of between about 10 and 300 Angstroms. The top surface of the solvent layer will be smooth, thus covering and eliminating the surface defects at the wafer surface 23.

While the wafer is still spinning, the low-k material is deposited over the pre-wetted surface 30. The spin rate is ramped up to the normal spin rate of about 3000 rpm, as illustrated in step 12. The low-k material is coated to the desired thickness; for example, of between about 50 Angstroms and 2 microns.

Next, as shown in step 14, the low-k material layer is dried by continued spinning at a spin rate of between about 3000 and 4000 rpm. Finally, the low-k material layer is baked (step 16) and cured (step 18) as conventional to complete deposition of the low-k material layer 34, as shown in FIG. 2.

The low-k material may be an organic type such as SILK by Dow Chemical (a polyphenylene polymer) or an inorganic type such as LKD by JSR (a methylsilsesquioxane based material), for example. Other possible low-k materials include Nanoglass-E, a porous silicon dioxide based material (Honeywell), XLK, a hydrogen silsesquioxane based material (Dow Corning), or any other low-k spin-on coating chemicals.

Solvents such as propylene glycol monomethyl ether acetate (PGMEA) may be used for organic materials such as SILK. Solvents such as gama-butyl lactone (GBL) or cyclohexanone may be used for inorganic materials such as Nanoglass-E or XLK, respectively.

The process of the present invention has been tried experimentally. Significant reduction of coating defects have been found using the process of the present invention.

Figure 3:
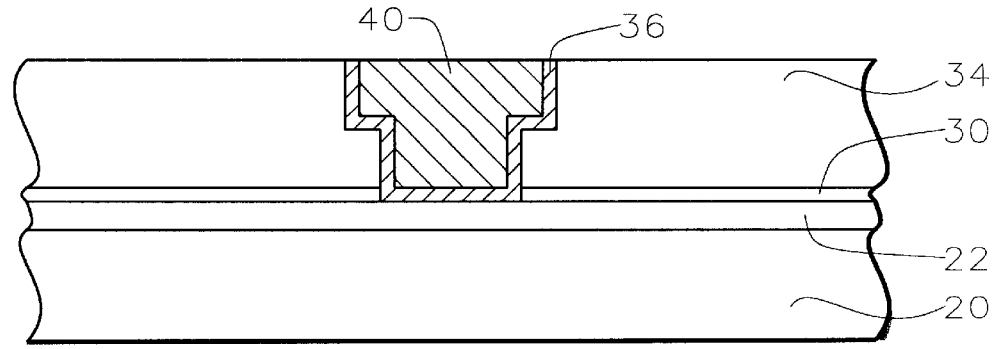

Processing continues as is conventional in the art to complete fabrication of the integrated circuit device. For example, a damascene opening may be etched through the low-k material/solvent layer 34/30 to an underlying region, not shown, to be contacted within layer 22. The damascene opening may be filled with a barrier metal layer 36 and metal layer 40 to complete the electrical connection, as shown in FIG. 3.

The process of the present invention provides a method to coat a low-k material layer without coating defects. A thinner or solvent is coated onto the wafer to pre-wet the wafer surface. The low-k material is coated over the pre-wetted surface, resulting in a defect-free layer.

While the invention has been particularly shown and described with reference to the preferred embodiments thereof, it will be understood by those skilled in the art that various changes in form and details may be made without departing from the spirit and scope of the invention.

What is claimed is:

1. A method of forming a low dielectric constant material layer in the fabrication of an integrated circuit device comprising:

providing a semiconductor substrate;

forming semiconductor device structures in and on said semiconductor substrate wherein said semiconductor device structures are chosen from the group containing gate electrodes, source and drain regions, and conductive lines;

coating a solvent overlying said semiconductor device structures;

coating a low dielectric constant material layer overlying said solvent to complete formation of said low dielectric constant material layer; and filling an opening etched through said low dielectric constant material layer and said solvent to one of said semiconductor device structures with a conductive layer to form an electrical connection in said fabrication of said integrated circuit device.

2. The method according to claim 1 wherein said surface of said semiconductor substrate includes surface defects, particles or roughness and wherein said solvent provides a smooth surface for said low dielectric constant material layer thereby preventing coating defects in said low dielectric constant layer.

3. The method according to claim 1 wherein said step of coating said solvent is performed at a spin rate of less than about 1000 rpm.

4. The method according to claim 1 wherein said step of coating said low dielectric constant material is performed while ramping up to a spin rate of about 3000 rpm.

5. The method according to claim 1 further comprising:
   drying said low dielectric constant material layer at a spin rate of between about 3000 and 4000 rpm;
   baking said low dielectric constant material layer; and
   curing said low dielectric constant material layer.

6. The method according to claim 1 wherein said low dielectric constant material has a dielectric constant of less than 3.

7. The method according to claim 1 wherein said low dielectric constant material is selected from the group containing: hydrogen silsesquioxane based materials (XLK), porous silicon dioxide based materials (Nanoglass-E), methylsilsesquioxane based materials (LKD), and polyphenylene polymers (SILK) having a thickness of between about 50 and 10,000 Angstroms.

8. The method according to claim 1 wherein said solvent is selected from the group containing: propylene glycol monomethyl ether acetate (PGMEA), gama-butyl lactone (GBL), and cyclohexanone.

9. The method according to claim 1 wherein said step of coating said solvent comprises between about 1 and 5 milliliters of said solvent.

10. The method according to claim 1 wherein said solvent is coated to a thickness of between about 10 and 300 Angstroms.

11. A method of forming a low dielectric constant material layer in the fabrication of an integrated circuit device comprising:

providing a semiconductor substrate;

forming semiconductor device structures in and on said semiconductor substrate wherein said semiconductor device structures are chosen from the group containing gate electrodes, source and drain regions, and conductive lines wherein a top surface of said semiconductor device structures has surface defects;

coating a solvent overlying said top surface of said semiconductor device structures;

coating a low dielectric constant material layer overlying said solvent wherein said solvent covers said surface defects thereby preventing defects in said low dielectric constant material layer to complete formation of said low dielectric constant material layer; and filling an opening etched through said low dielectric constant material layer and said solvent to one of said semiconductor device structures with a conductive layer to form an electrical connection in said fabrication of said integrated circuit device.

12. The method according to claim 11 wherein said surface defects includes particles or roughness.

13. The method according to claim 11 wherein said step of coating said solvent is performed at a spin rate of less than about 1000 rpm.

14. The method according to claim 11 wherein said step of coating said low dielectric constant material is performed while ramping up to a spin rate of about 3000 rpm.

15. The method according to claim 11 further comprising:
    drying said low dielectric constant material layer at a spin rate of between about 3000 and 4000 rpm;
    baking said low dielectric constant material layer; and
    curing said low dielectric constant material layer.

16. The method according to claim 11 wherein said low dielectric constant material has a dielectric constant of less than 3.

17. The method according to claim 11 wherein said low dielectric constant material is selected from the group containing: hydrogen silsesquioxane based materials (XLK), porous silicon dioxide based materials (Nanoglass-E), methylsilsesquioxane based materials (LKD), and polyphenylene polymers (SILK) having a thickness of between about 50 and 10,000 Angstroms.

18. The method according to claim 11 wherein said solvent is selected from the group containing: propylene glycol monomethyl ether acetate (PGMEA), gama-butyl lactone (GBL), and cyclohexanone.

19. The method according to claim 11 wherein said step of coating said solvent comprises between about 1 and 5 milliliters of said solvent.

20. The method according to claim 19 wherein said solvent is coated to a thickness of between about 10 and 300 Angstroms.

21. A method of forming a low dielectric constant material layer in the fabrication of an integrated circuit device comprising:

providing a semiconductor substrate;

forming semiconductor device structures in and on said semiconductor substrate wherein said semiconductor device structures are chosen from the group containing gate electrodes, source and drain regions, and conductive lines wherein a top surface of said semiconductor device structures has surface defects;

coating a solvent overlying said top surface of said semiconductor device structures at a spin rate of less than 1000 rpm;

coating a low dielectric constant material layer overlying said solvent while ramping up said spin rate to 3000 rpm wherein said solvent covers said surface defects thereby preventing defects in said low dielectric constant material layer to complete formation of said low dielectric constant material layer; and filling an opening etched through said low dielectric constant material layer and said solvent to one of said semiconductor device structures with a conductive layer to form an electrical connection in said fabrication of said integrated circuit device.

22. The method according to claim 21 wherein said surface defects includes particles or roughness.

23. The method according to claim 21 further comprising:

drying said low dielectric constant material layer at a spin rate of between about 3000 and 4000 rpm;

baking said low dielectric constant material layer; and curing said low dielectric constant material layer.

24. The method according to claim 21 wherein said low dielectric constant material has a dielectric constant of less than 3.

25. The method according to claim 21 wherein said low dielectric constant material is selected from the group containing: hydrogen silsesquioxane based materials (XLK), porous silicon dioxide based materials (Nanoglass-E), methylsilsesquioxane based materials (LKD), and polyphenylene polymers (SILK) having a thickness of between about 50 and 10,000 Angstroms.

26. The method according to claim 21 wherein said solvent is selected from the group containing: propylene glycol monomethyl ether acetate (PGMEA), gama-butyl lactone (GBL), and cyclohexanone.

27. The method according to claim 21 wherein said step of coating said solvent comprises between about 1 and 5 milliliters of said solvent.

28. The method according to claim 27 wherein said solvent is coated to a thickness of between about 10 and 300 Angstroms.

* * * * *